United States Patent

Okumura et al.

[11] Patent Number: 5,942,794
[45] Date of Patent: Aug. 24, 1999

[54] PLASTIC ENCAPSULATED SEMICONDUCTOR DEVICE AND METHOD OF MANUFACTURING THE SAME

[75] Inventors: Ichiro Okumura, Kyoto; Masanori Minamio; Akio Kuito, both of Osaka; Takeshi Morikawa, Shiga; Toshiyuki Fukuda; Fumito Itoh, both of Osaka, all of Japan

[73] Assignee: Matsushita Electronics Corporation

[21] Appl. No.: 08/955,441

[22] Filed: Oct. 21, 1997

[30] Foreign Application Priority Data

Oct. 22, 1996 [JP] Japan .................................. 8-279169
Feb. 5, 1997 [JP] Japan .................................. 9-022337

[51] Int. Cl.⁶ .......................... H01L 23/495; H01L 23/48; H01L 23/28
[52] U.S. Cl. .......................... 257/666; 257/693; 257/787
[58] Field of Search .................................. 257/666, 670, 257/669, 676, 672, 693, 692, 694, 787, 790

[56] References Cited

U.S. PATENT DOCUMENTS

| | | | |
|---|---|---|---|
| 5,172,214 | 12/1992 | Castro | 257/693 |
| 5,233,222 | 8/1993 | Djennas et al. | 257/666 |
| 5,302,849 | 4/1994 | Cavasin | 257/666 |
| 5,389,739 | 2/1995 | Mills | 257/666 |
| 5,428,248 | 6/1995 | Cha | 257/676 |
| 5,529,959 | 6/1996 | Yamanaka | 257/704 |
| 5,705,431 | 1/1998 | Mori | 438/123 |
| 5,712,507 | 1/1998 | Eguchi et al. | 257/676 |
| 5,808,325 | 9/1998 | Webb | 257/666 |

FOREIGN PATENT DOCUMENTS

| | | | |
|---|---|---|---|
| 54-140474 | 10/1979 | Japan | 257/787 |
| 362108553 | 5/1987 | Japan | 257/787 |
| 1-80055 | 3/1989 | Japan | 257/666 |
| 4-318959 | 10/1992 | Japan | 257/666 |
| 06334106 | 2/1994 | Japan . | |

*Primary Examiner*—Mahshid Saadat
*Assistant Examiner*—Jhihan B Clark
*Attorney, Agent, or Firm*—McDermott, Will & Emery

[57] ABSTRACT

A plastic encapsulated semiconductor device comprises a die pad, die pad support pins suspending the die pad, a semiconductor chip mounted on the die pad, thin metal wires for connecting the electrode of the semiconductor chip to leads, and a sealing resin sealing the foregoing components, while the respective bottom faces of the leads forming terminal portions are exposed. An upset process is performed with respect to the die pad support pins of a lead frame to form stepped portions such that the die pad is positioned higher in level than the leads. Since the lower portion of the sealing resin also underlies the die pad, enhanced adhesion is achieved between the die pad and the sealing rein, resulting in higher reliability. With the die pad positioned higher in level than the leads, there is no possibility of interference between the leads and the semiconductor chip even when the size of the semiconductor chip is freely changed. This enables the scaling up of a semiconductor chip and increases a packaging density in mounting semiconductor devices on a mother substrate.

13 Claims, 11 Drawing Sheets

Fig. 7(a)
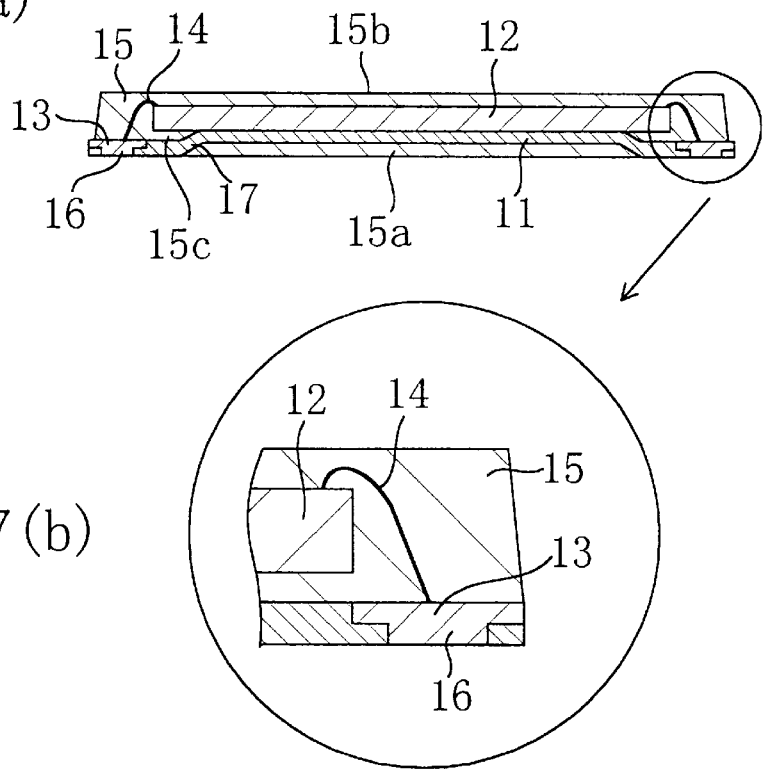
Fig. 7(b)
Fig. 7(c)
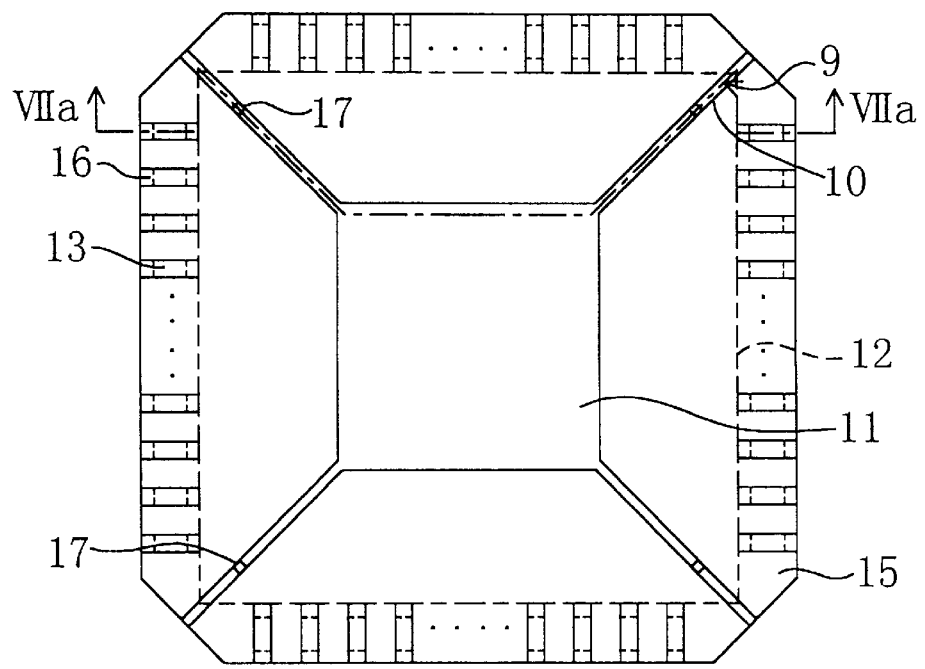

Fig. 9(a)
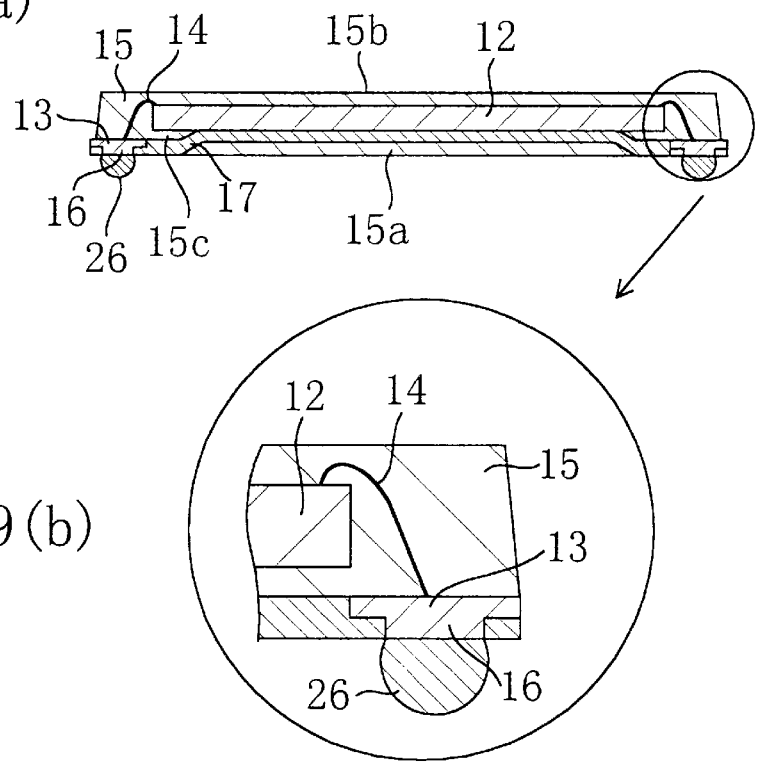
Fig. 9(b)
Fig. 9(c)
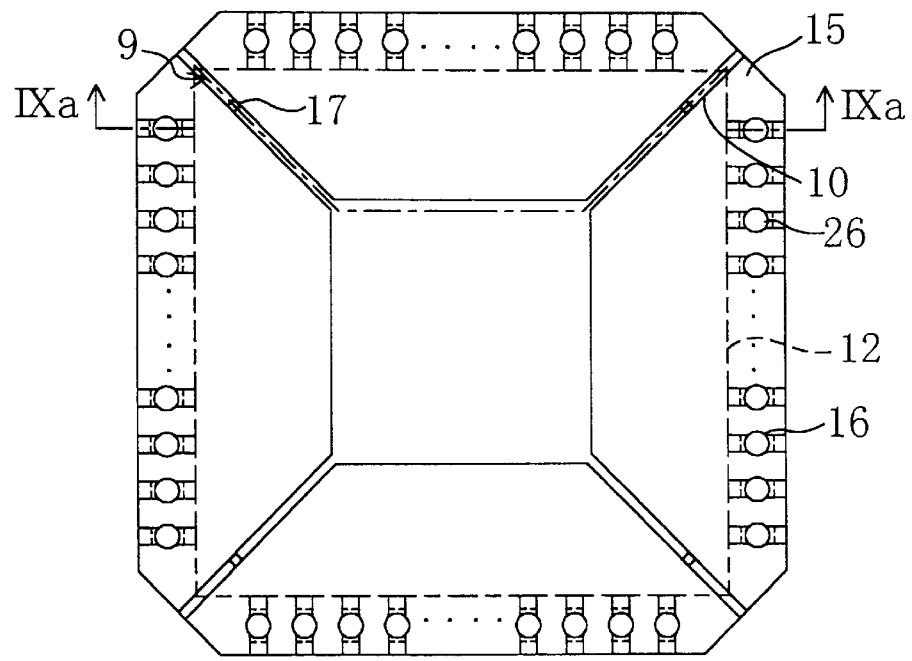

PLASTIC ENCAPSULATED SEMICONDUCTOR DEVICE AND METHOD OF MANUFACTURING THE SAME

BACKGROUND OF THE INVENTION

The present invention relates to a plastic encapsulated semiconductor device wherein a semiconductor chip mounted on a lead frame is encapsulated together with inner leads in a plastic resin and a manufacturing method therefor. More particularly, it relates to a method of implementing a plastic encapsulated semiconductor device with a thinner profile and higher reliability.

As more semiconductor devices have been mounted on a mother substrate in a higher density, miniaturization and a thinner profile have been required of a recent semiconductor product to be mounted on the mother substrate. To implement a miniaturized semiconductor device with a thinner profile, a TAB technique using a plastic tape has been developed. A thin-profile semiconductor device may also be implemented by using a lead frame instead of the TAB technique. For example, there has been developed a single-side plastic encapsulated semiconductor device wherein only one side of the lead frame provided with a semiconductor chip is sealed with a sealing resin.

Referring to FIG. 11, a conventional single-side plastic encapsulated semiconductor device will be described.

As shown in the drawing, a semiconductor chip 103 is mounted on a die pad 102 of a lead frame 101. An electrode of the semiconductor chip 103 is electrically connected to inner leads 104 of the lead frame 101 via thin metal wires 105. The semiconductor chip 103, die pad 102, inner leads 104, and thin metal wires 105 are sealed with a sealing resin 106 only on the top side of the lead frame 101 provided with the semiconductor chip 103.

In the plastic encapsulated semiconductor device shown in FIG. 11, outer leads 107 serving as external electrodes are arranged on the bottom face of the semiconductor device, while only the side of the lead frame 101 provided with the semiconductor chip 103 is sealed with the sealing resin 106. Since the back side of the lead frame 101 is not substantially sealed, a thin profile is achieved. Tip portions 104a of the inner leads 104 of the lead frame 101 are formed to have tapered profiles to exhibit sufficient adhesion to the sealing resin 106.

The conventional single-side plastic encapsulated semiconductor device shown in FIG. 11 is manufactured by the following procedures.

First, the tip portions 104a of the inner leads 4 are formed to have tapered profiles by mechanical or chemical processing. Then, the semiconductor chip 103 is bonded onto the die pad 102. Subsequently, the electrode of the semiconductor chip 103 is electrically connected to the inner leads 104 by means of the thin metal wires 105. Thereafter, the side of the lead frame 101 provided with the semiconductor chip 103 is sealed with the plastic resin 106 by transfer molding. Final processing such as the bending of the outer leads 107 protruding from the sealing resin 106 is performed to complete the manufacturing of the plastic encapsulated semiconductor device.

FIG. 12 shows another conventional single-side plastic encapsulated semiconductor having a structure different from that of the plastic encapsulated semiconductor device shown in FIG. 11.

As shown in FIG. 12, an insulating plastic tape 108 for interconnecting the individual inner leads 104 of the lead frame 101 is provided to function as a die pad for carrying the semiconductor chip 103. After the semiconductor chip 103 is mounted on the plastic tape 108, the electrode of the semiconductor chip 103 is electrically connected to the inner leads 104 by means of the thin metal wires 105. Thereafter, the semiconductor chip 103, the inner leads 104, and the thin metal wires 105 are sealed with the sealing resin 106 on the side of the lead frame 101 provided with the semiconductor chip 103.

The plastic encapsulated semiconductor device shown in FIG. 12 has the advantage of achieving a thinner profile over the plastic encapsulated semiconductor device shown in FIG. 11. In contrast to the plastic encapsulated semiconductor device shown in FIG. 11 wherein the semiconductor chip 103 is mounted on the die pad 102 having the top face substantially flush with the top faces of the inner leads 104, the inner leads 104 and the semiconductor chip 103 are mounted on the plastic tape 108 in the plastic encapsulated semiconductor device shown in FIG. 12. Accordingly, the difference in level between the top faces of the inner leads 104 and the top face of the semiconductor chip 103 is smaller in the semiconductor device shown in FIG. 12 than in the semiconductor device shown in FIG. 11, so that the sealing resin 106 has a smaller thickness in the semiconductor device shown in FIG. 12. As a result, the whole plastic encapsulated semiconductor device has a reduced thickness.

To achieve a thinner profile, however, only one side of the lead frame 101 provided with the semiconductor chip 103, i.e., the top side of the lead frame 101 is substantially in contact with the sealing resin 106 in each of the conventional semiconductor devices shown in FIGS. 11 and 12. The arrangement reduces a contact area between the lead frame 101 and the sealing resin 106 and impairs adhesion therebetween, leading to degraded reliability of the final product.

Moreover, since only one side of the lead frame 101 is substantially sealed with a plastic resin, a stress in the sealing resin 106 may adversely affect the semiconductor chip 103 or cause cracking in the sealing resin 106 composing a package.

SUMMARY OF THE INVENTION

It is therefore an object of the present invention to provide a plastic encapsulated semiconductor device having a thinner profile and higher reliability and a manufacturing method therefor by providing a sealing resin under a part of a lead frame or under the semiconductor chip as well.

A first plastic encapsulated semiconductor device according to the present invention comprises: a plurality of die pad support pins; a die pad suspended by the plurality of die pad support pins; a plurality of leads extending toward the die pad; a semiconductor chip mounted on the die pad; thin metal wires connecting a part of the semiconductor chip to the individual leads; and a sealing resin sealing a region containing the semiconductor chip, the die pad, the die pad support pins, the leads, and the thin metal wires with respective bottom faces and outer side faces of the leads being exposed, each of the die pad support pins being partially bent such that the die pad is positioned higher in level than the leads, the sealing resin partially underlying the die pad.

In the arrangement, the sealing resin also underlies the die pad composing a part of the lead frame, which provides enhanced adhesion between the sealing resin and the lead frame, resulting in a semiconductor device retaining high reliability. Since the die pad is positioned higher in level than the leads, the size of the semiconductor chip can be changed with no interference with the leads, which substantially increases the packaging density.

Preferably, the die pad occupies an area smaller than an area occupied by the semiconductor chip.

The arrangement provides enhanced adhesion between the semiconductor chip and the sealing resin, resulting in a semiconductor device with higher reliability.

Preferably, the die pad has an opening.

The arrangement provides enhanced adhesion between the semiconductor chip and the sealing resin and reduces the amount of an adhesive required to bond the semiconductor chip to the die pad, which suppresses the cracking of a package and improves the reliability of the semiconductor device.

Each of the leads may have an inner tip extending to a point under the semiconductor device.

The arrangement provides enhanced adhesion between the leads and the sealing resin and suppresses the peeling off of the leads, resulting in a semiconductor device with higher reliability.

Each of the leads has a stepped portion formed by removing an inner bottom portion thereof in such a manner as to substitute the sealing resin for the removed inner bottom portion.

The arrangement provides enhanced adhesion between the leads and the sealing resin, resulting in a semiconductor device with higher reliability.

The plastic encapsulated semiconductor device may further comprise ball electrodes formed on respective exposed terminal portions of the leads.

The arrangement enables the semiconductor device to be mounted on the mother substrate with increased stability.

Inner and outer bottom portions of each of the leads are removed in such a manner that the sealing resin substitutes for the removed inner and outer bottom portions with only a middle bottom portion of the lead being uncovered with the sealing resin.

The arrangement provides further enhanced adhesion between the semiconductor chip, resulting in a semiconductor device with higher reliability.

An outer side portion of each of the leads protruding from a side face of the sealing resin has a length of 0.2 mm or less.

The arrangements prevents the deformation of the leads protruding from the sealing resin and provides higher reliability.

A second plastic encapsulated semiconductor device according to the present invention comprises: a semiconductor chip; a plurality of leads extending outwardly, while carrying the semiconductor chip on respective inner portions thereof; a semiconductor chip mounted on the leads; thin metal wires connecting a part of the semiconductor chip to the individual leads; and a sealing resin sealing a region containing the semiconductor chip, the leads, and the thin metal wires, the sealing resin partially underlying the semiconductor chip with respective bottom faces and outer side faces of the leads being exposed.

The arrangement provides enhanced adhesion between the semiconductor chip and the sealing resin and reduces a level difference between the top face of the semiconductor chip and the top faces of the leads, resulting in a thinner-profile semiconductor device.

A third plastic encapsulated semiconductor device according to the present invention comprises: a plurality of die pad support pins; a die pad having an opening and suspended by the plurality of die pad support pins; a plurality of leads extending toward the die pad; a semiconductor chip mounted on the die pad and occupying an area larger than an area occupied by the die pad; thin metal wires connecting a part of the semiconductor chip to the individual leads; and a sealing resin sealing a region containing the semiconductor chip, the die pad, the die pad support pins, the leads, and the thin metal wires, the sealing resin partially underlying the die pad with respective bottom faces and outer side faces of the leads being exposed.

The arrangement reduces the amount of the adhesive required to bond the semiconductor chip to the die pad, which suppresses cracking of a package and improves the reliability of the semiconductor device.

Preferably, regions of the die pad connected to the die pad support pins occupy an area larger than an area occupied by the other region of the die pad.

The arrangement provides a sufficiently wide region to which the adhesive is supplied dropwise and spread to bond the semiconductor chip to the die pad, resulting in a smoother bonding operation and higher reliability.

In this case, each of the regions of the die pad connected to the die pad support pins may have a circular configuration or a rectangular configuration.

A method of manufacturing a plastic encapsulated semiconductor device according to the present invention comprises: a first step of forming a lead frame having an outer frame, a plurality of die pad support pins extending from the outer frame, a die pad suspended by the plurality of die pad support pins, and a plurality of leads extending from the outer frame toward the die pad, each of the components being positioned on a substantially equal level; a second step of partially bending each of the die pad support pins to form a stepped portion such that the die pad of the lead frame is positioned higher in level than the leads; a third step of bonding a semiconductor chip onto the die pad; a fourth step of connecting a part of the semiconductor chip to the individual leads by means of thin metal wires; a fifth step of sealing a region containing the semiconductor chip, the die pad, the die pad support pins, the leads, and the thin metal wires with a sealing resin such that respective bottom faces of the leads are exposed and that the sealing resin partially underlies the die pad; and a sixth step of cutting off the leads of the lead frame outside the sealing resin to separate the outer frame of the lead frame.

BRIEF DESCRIPTION OF THE DRAWINGS

FIG. 7(a) is a cross-sectional view of a plastic encapsulated semiconductor device according to a seventh embodiment of the present invention, FIG. 7(b) is a partial cross-sectional view thereof, and FIG. 7(c) is a bottom view thereof when viewed transparently through a sealing resin;

FIG. 9(a) is a cross-sectional view of a plastic encapsulated semiconductor device according to a seventh embodiment of the present invention, FIG. 9(b) is a partial cross-sectional view thereof, and FIG. 9(c) is a bottom view thereof when viewed transparently through a sealing resin;

DETAILED DESCRIPTION OF THE INVENTION

Figure 1A:
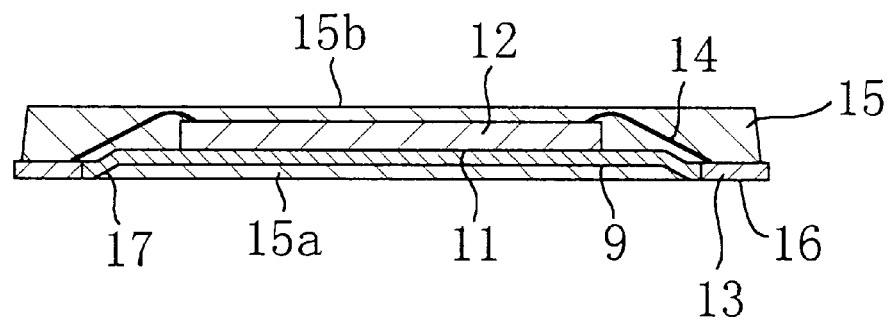
FIG. 1(a) is a cross-sectional view of a plastic encapsulated semiconductor device according to a first embodiment of the present invention and FIG. 1(b) is a bottom view thereof when viewed transparently through a sealing resin.

Referring now to the drawings, plastic encapsulated semiconductor devices according to the individual embodiments of the present invention will be described.

(First Embodiment)

Figure 1B:
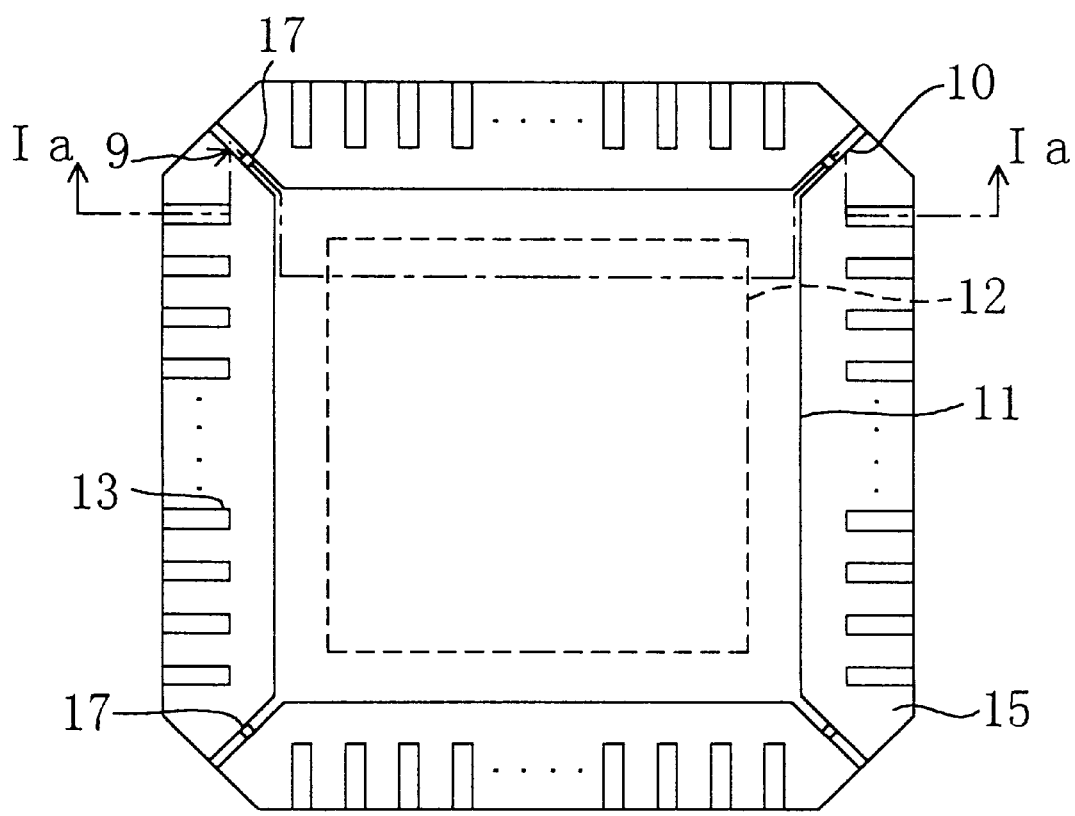

FIGS. 1(a) and 1(b) show the structure of a plastic encapsulated semiconductor device according to a first embodiment of the present invention, of which FIG. 1(a) is a cross-sectional view taken along the line Ia—Ia of FIG. 1(b) and FIG. 1(b) is a bottom view. For the sake of convenience, it is assumed in FIG. 1(b) that a sealing resin is transparent and the portion enclosed in the broken rectangle corresponds to a semiconductor chip.

As shown in the drawings, the plastic encapsulated semiconductor device according to the present embodiment comprises: die pad support pins 10 of a lead frame 9; a die pad 11 suspended by the die pad support pins 10; a semiconductor chip 12 mounted on the die pad 11; thin metal wires 14 for electrically connecting an electrode (not shown) on the top face of the semiconductor chip 12 to leads 13; and a sealing resin 15 for sealing the foregoing components 10, 11, 12, 13, and 14.

Figure 11:
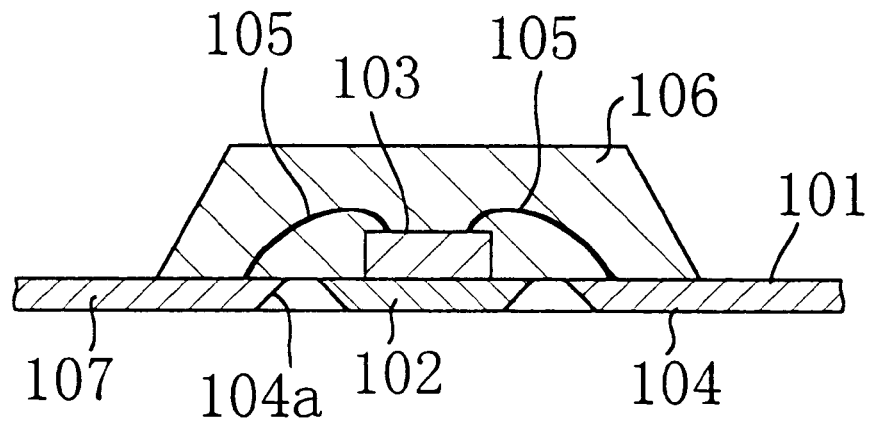
FIG. 11 is a cross-sectional view of a conventional single-side plastic encapsulated semiconductor device.
Figure 12:
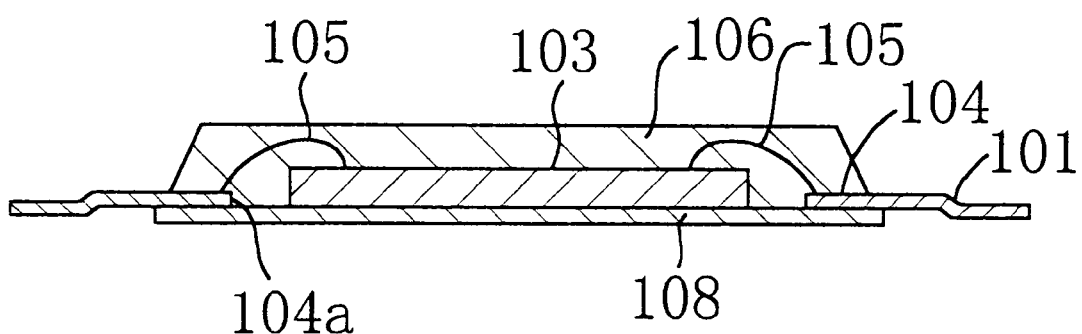
FIG. 12 is a cross-sectional view of another conventional single-side plastic encapsulated semiconductor device using a plastic tape.

The leads 13 are barely protruding from the side faces of the sealing resin 15 (a protrusion length of about 0.2 mm or less) and are substantially flush with the side faces. The leads 13 used in the present embodiment are formed with minimum lengths of outer leads protruding from the sealing resin as provided in the conventional semiconductor devices shown in FIGS. 11 and 12. The outer leads correspond to the portions of the lead frame located outside the dam bars. The semiconductor device according to the present embodiment is signally connected to external equipment by connecting terminal portions 16 constituted by the bottom portions of the leads 13 to wiring on a mother substrate. This prevents deformation of the outer leads conventionally provided and implements a plastic encapsulated semiconductor device of surface-mounting type.

The semiconductor device according to the present embodiment is characterized by a so-called upset process whereby the die pad support pins 10 are bent to form respective stepped portions 17 such that the die pad 11 is positioned higher in level than the leads 13. In the structure formed by the upset process, the lower portion 15a of the sealing resin 15 also underlies the die pad 11. The thickness of the lower portion 15a is basically equal to the height of the stepped portion 17 of the die pad support pin 10. Consequently, the strength of adhesion between the entire lead frame 9 and the sealing resin 15 is enhanced and the reliability of the plastic encapsulated semiconductor device is increased.

Since the semiconductor chip 12 is positioned higher in level than the leads 13, the uppermost portions of the thin metal wires 14 relative to the top face of the semiconductor chip 12 is lower in level than in the conventional single-side plastic encapsulated semiconductor device wherein the die pad 11 is in the same plane as the leads 13. This is because the vertical position of the lead 13 relative to the top face of the semiconductor chip 12 has been lowered. Compared with the conventional single-side plastic encapsulated semiconductor device, an increase in the thickness of the whole semiconductor device caused by the upset process according to the present invention is smaller than the thickness of the lower portion 15a of the sealing resin 15 underlying the die pad 11. This also holds true for each of the embodiments (except for a sixth embodiment), which will be described later.

In the case of a double-side plastic encapsulated semiconductor device, the top faces of the leads are substantially flush with the top face of the semiconductor chip so that the uppermost portions of the thin metal wires relative to the top face of the semiconductor chip are much higher in level than in the plastic encapsulated semiconductor device according to the present invention. Accordingly, the thickness of the sealing resin on the top side of the semiconductor chip should be much larger than in the plastic encapsulated semiconductor device according to the present invention. Moreover, since the thickness of the sealing resin on the top side of the semiconductor chip is substantially equal to the thickness of the sealing resin on the bottom side thereof in the double-side plastic encapsulated semiconductor device, it will easily be understood that the thickness of the whole semiconductor device has greatly been increased.

In the present embodiment, the thickness of the whole plastic encapsulated semiconductor device is 0.7 mm, which indicates the achievement of a reduced thickness far smaller than the objective value of the overall thickness obtained by adding 1 mm to the thickness of the semiconductor chip. The height of the stepped portion of the die pad support pin 10 formed by the upset process is 0.1 mm, while the thickness of the lower portion 15a of the sealing resin 15 underlying the die pad 11 is 0.1 mm. The thickness of the semiconductor chip 12 is 0.2 mm, while the thickness of the upper portion 15b of the sealing resin 15 overlying the semiconductor chip 12 is 0.15 mm. The thickness of the lead frame 9 is 0.15 mm.

Preferably, the thickness of the lower portion 15a of the sealing resin 15 underlying the die pad 11 is 15 mm or less and smaller than the thickness of the upper portion 15b. More preferably, the thickness of the lower portion 15a of the sealing resin 15 underlying the die pad 11 is 0.10 mm or less and equal to or less than 70% of the thickness of the upper portion 15b.

Since the leads 13 are positioned lower in level than the die pad 11 of the lead frame 9, there is no possibility of the semiconductor chip 12 interfering with the leads 13 even when the lateral dimension of the semiconductor chip 12 is increased, which achieves the effect of freely changing the size of the semiconductor chip 12.

In summary, the lower portion 15a of the sealing resin 15 underlies the die pad 11 due to the upset process for positioning the die pad 11 higher in level than the leads 13 in the plastic encapsulated semiconductor device according to the present invention. The structure achieves a significant reduction in the overall thickness than in the conventional double-side plastic encapsulated semiconductor device. Compared with the conventional single-side plastic encapsulated semiconductor device shown in FIG. 11, the structure provides higher reliability, while suppressing an increase in the overall thickness.

Next, a method of manufacturing a plastic encapsulated semiconductor device according to the present embodiment will be described with reference to FIGS. 1(a) and 1(b).

First, the lead frame 9 having the die pad 11, the die pad support pins 10, the leads 13, and the like is formed in an outer frame. Then, the upset process is performed by pressing the respective middle portions of the die pad support pins 10 suspending the die pad 11 to raise the die pad 11, resulting in the stepped portions 17 formed at the respective midpoints of the die pad support pins 10. Thereafter, the semiconductor chip 12 is mounted on the die pad 11 by joining together the top face of the die pad 11 and the bottom face of the semiconductor chip 12 by using a conductive adhesive.

Next, the electrode of the semiconductor chip 12 on the die pad 11 is electrically connected to the leads 13 of the lead frame 9 by means of the thin metal wires 14.

Next, a region including the die pad support pins 10, the die pad 11, the semiconductor chip 12, the leads 13, and the thin metal wires 14 is sealed with the sealing resin 15 by transfer molding. As a result, the lower portion 15a of the sealing resin 15 underlies the bottom face of the die pad 11 and the upper portion 15b of the sealing resin 15 containing the thin metal wires 14 overlies the top face of the semiconductor chip 12. The bottom face of the lower portion 15a of the sealing resin 15 is substantially flush with the bottom faces of the respective terminal portions 16 of the leads 13, while the top face of the upper portion 15b of the sealing resin 15 is higher in level than the uppermost portions of the thin metal wires 14. In the plastic sealing step, a mold having in principle a cavity only in one side thereof should be used to prevent the sealing resin 15 from underlying the bottom portions of the leads 13 and thereby achieve hermetical sealing.

Thereafter, the formation (cutting off) of the leads 13 of the lead frame 9 including separation of the outer frame is performed. Here, the leads 13 are formed such that the outer side portions of the leads 13 are substantially flush with the side faces of the sealing resin 15 (a protrusion length of 0.2 mm or less).

The foregoing procedures enable easy formation of the plastic encapsulated semiconductor device according to the first embodiment.

(Second Embodiment)

Figure 2A:
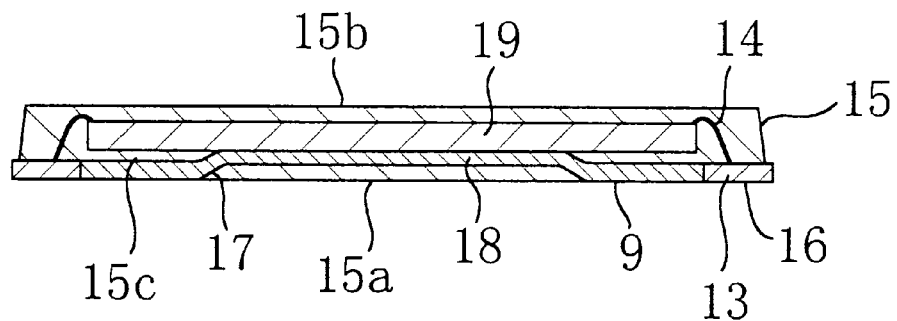
FIG. 2(a) is a cross-sectional view of a plastic encapsulated semiconductor device according to a second embodiment of the present invention and FIG. 2(b) is a bottom view thereof when viewed transparently through a sealing resin.
Figure 2B:
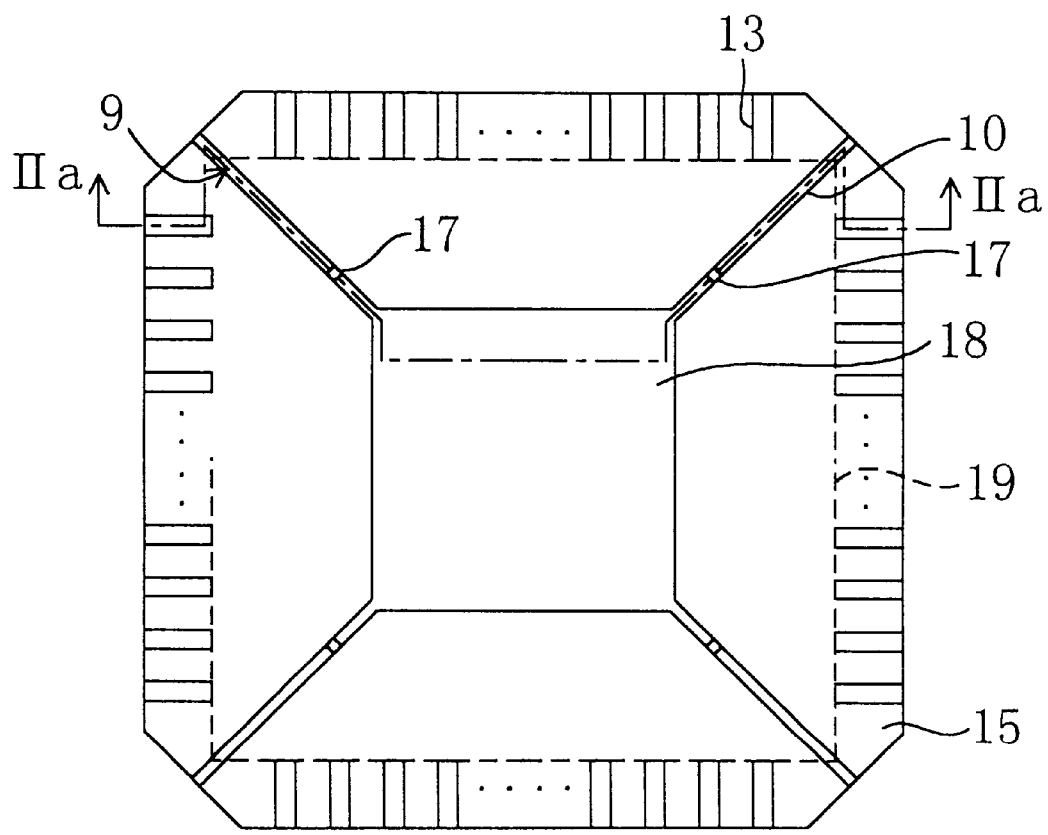

FIGS. 2(a) and 2(b) show the structure of a plastic encapsulated semiconductor device according to a second embodiment of the present invention, of which FIG. 2(a) is a cross-sectional view taken along the line IIa—IIa of FIG. 2(b) and FIG. 2(b) is a bottom view. For the sake of convenience, it is assumed in FIG. 2(b) that a sealing resin is transparent and the portion enclosed in the broken rectangle corresponds to a semiconductor chip.

The plastic encapsulated semiconductor device according to the second embodiment of the present invention will be described with reference to the drawings.

As shown in the drawings, the plastic encapsulated semiconductor device according to the present embodiment comprises: die pad support pins 10 of a lead frame 9; a die pad 18 suspended by the die pad support pins 10; a semiconductor chip 19 mounted on the die pad 18; thin metal wires 14 for electrically connecting an electrode (not shown) on the top face of the semiconductor chip 19 to leads 13; and a sealing resin 15 for sealing the foregoing components 10, 18, 19, 13, and 14. The upset process has been performed to form the die pad support pins 10 with respective stepped portions 17. In the structure produced by the upset process, the lower portion 15a of the sealing resin 15 underlies the die pad 18. The leads 13 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 13 to wiring on a mother substrate. The structure of the plastic encapsulated semiconductor device according to the present embodiment described above is basically the same as that of the plastic encapsulated semiconductor device according to the first embodiment.

In contrast to the first embodiment, the plastic encapsulated semiconductor device according to the present embodiment is characterized in that the area occupied by the die pad 18 is smaller than the bottom area of the semiconductor chip 19, which is different from the first embodiment in which the die pad 11 occupies an area larger than the area occupied by the semiconductor chip 12. By thus reducing the size of the die pad 18, a side portion 15c of the sealing resin 15 underlies the semiconductor chip 19 in such a manner as to surround the die pad 18. The adhesion between the semiconductor chip 19 and the sealing resin 15 is enhanced by the force of bonding between the side portion 15c and the bottom portion of the semiconductor chip 19, which further improves reliability. Although the semiconductor chip 19 larger in size than the semiconductor chip 12 shown in FIG. 1 has been contained in the sealing resin 15, the plastic encapsulated semiconductor device according to the present embodiment retains high reliability since the structure thereof provides enhanced adhesion between the semiconductor chip 19 and the sealing resin 15.

The present embodiment provides an extremely thin-profile plastic encapsulated semiconductor device with an overall thickness of 0.7 mm. The height of the stepped portion of the die pad support pin 10 formed by the upset process is 0.1 mm, while the thickness of the lower portion 15a of the sealing resin 15 underlying the die pad 18 is 0.1 mm. The thickness of the semiconductor chip 19 is 0.2 mm, while the thickness of the upper portion 15a of the sealing resin 15 overlying the semiconductor chip 19 is 0.15 mm. The thickness of the lead frame 9 is 0.15 mm.

In summary, the plastic encapsulated semiconductor device according to the present embodiment can achieve the same effect as achieved by the semiconductor device according to the first embodiment. It can also achieve the remarkable effects of enhancing adhesion between the bottom portion of the semiconductor chip 19 and the sealing resin 15 with the provision of the die pad 18 smaller in size than the semiconductor chip 19 and suppressing the cracking of a package. The package is cracked when moisture contained in an adhesive lying between the die pad and the semiconductor chip expands by evaporation. Accordingly, the die pad 18 occupying a reduced area requires only a small amount of adhesive, which suppresses the cracking of the package.

Next, a method of manufacturing the plastic encapsulated semiconductor device according to the present embodiment will be described with reference to FIGS. 2(a) and 2(b).

First, the lead frame 9 having the die pad 18, the die pad support pins 10, the leads 13, and the like is formed in an outer frame. Then, the upset process is performed by pressing the respective middle portions of the die pad support pins 10 suspending the die pad 18 to raise the die pad 18, resulting in the stepped portions 17 formed at the respective midpoints of the die pad support pins 10. Thereafter, the semiconductor chip 19 is mounted on the die pad 18 by joining together the top face of the die pad 18 and the bottom portion of the semiconductor chip 19 by using a conductive adhesive. Here, the die pad 18 is designed to occupy an area smaller than an area occupied by the semiconductor chip 19 mounted thereon.

Next, the electrode of the semiconductor chip 19 on the die pad 18 is electrically connected to the leads 13 of the lead frame 9 by means of the thin metal wires 14.

Next, a region including the die pad support pins 10, the die pad 18, the semiconductor chip 19, the leads 13, and the thin metal wires 14 is sealed with the sealing resin 15 by transfer molding. As a result, the lower portion 15a of the sealing resin 15 underlies the bottom face of the die pad 18, the upper portion 15b of the sealing resin 15 containing the thin metal wires 14 overlies the top face of the semiconductor chip 19, and the side portion 15c of the sealing resin 15 underlies the semiconductor chip 19 in such a manner as to surround the die pad 18. The bottom face of the lower portion 15a of the sealing resin 15 is substantially flush with the bottom faces of the respective terminal portions 16 of the leads 13, while the top face of the upper portion 15b is higher in level than the uppermost portions of the thin metal wires 14. In the plastic sealing step, a mold having in principle a cavity only in one side thereof should be used to prevent the sealing resin 15 from underlying the bottom portions of the leads 13 and thereby achieve hermetical sealing.

Thereafter, the formation (cutting off) of the leads 13 of the lead frame 9 including separation of the outer frame is performed. Here, the leads 13 are formed such that the outer side portions of the leads 13 are substantially flush with the side faces of the sealing resin (a protrusion length of 0.2 mm or less).

The foregoing procedures enable easy formation of the plastic encapsulated semiconductor device according to the second embodiment.

(Third Embodiment)

A plastic encapsulated semiconductor device according to a third embodiment of the present invention will be described with reference to the drawings.

Figure 3A:
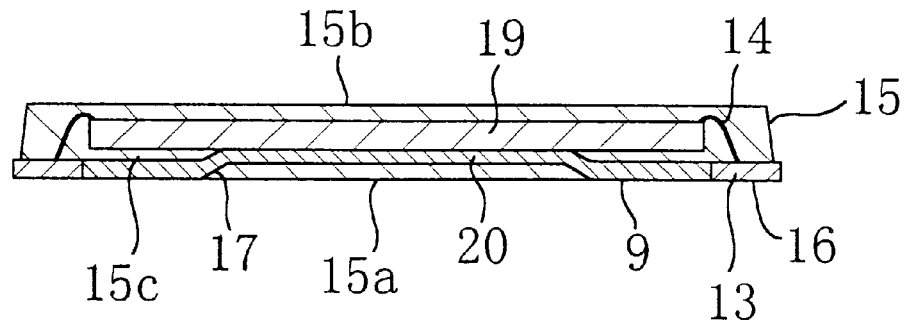
FIG. 3(a) is a cross-sectional view of a plastic encapsulated semiconductor device according to a third embodiment of the present invention and FIG. 3(b) is a bottom view thereof when viewed transparently through a sealing resin.
Figure 3B:
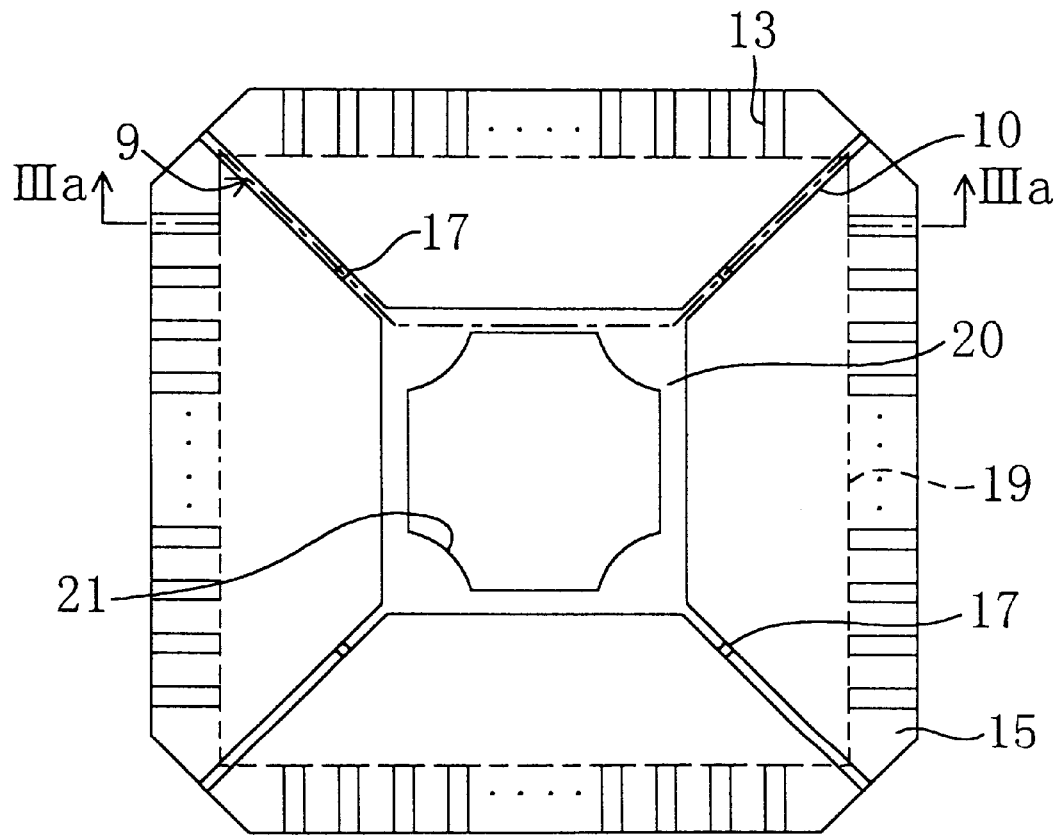

FIGS. 3(a) and 3(b) show the structure of the plastic encapsulated semiconductor device according to the third embodiment of the present invention, of which FIG. 3(a) is a cross-sectional view taken along the line IIIa—IIIa of FIG. 3(b) and FIG. 3(b) is a bottom view. For the sake of convenience, it is assumed in FIG. 3(b) that a sealing resin is transparent and the portion enclosed in the broken rectangle corresponds to a semiconductor chip.

As shown in the drawings, the plastic encapsulated semiconductor device according to the present embodiment comprises: die pad support pins 10 of a lead frame 9; a die pad 20 suspended by the die pad support pins 10; a semiconductor chip 19 mounted on the die pad 20; thin metal wires 14 for electrically connecting an electrode (not shown) on the top face of the semiconductor chip 19 to leads 13; and a sealing resin 15 for sealing the foregoing components 10, 20, 19, 13, and 14. The upset process has been performed to form the die pad support pins 10 with respective stepped portions 17, whereby the die pad 20 is positioned higher in level than the leads 13. In the resulting structure, the lower portion 15a of the sealing resin 15 underlies the die pad 20. The area occupied by the die pad 20 is reduced to be smaller than the bottom area of the semiconductor chip 19 so that the side portion 15c of the sealing resin 15 underlies the semiconductor chip 19 in such a manner as to surround the die pad 20. The adhesion between the semiconductor chip 19 and the sealing resin 15 has been enhanced by the force of bonding between the side portion 15c and the bottom portion of the semiconductor chip 19. The leads 13 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 13 to wiring on a mother substrate. The structure of the plastic encapsulated semiconductor device according to the present embodiment described above is basically the same as that of the plastic encapsulated semiconductor device according to the second embodiment.

In contrast to the second embodiment, the plastic encapsulated semiconductor device according to the present embodiment is characterized in that the die pad 20 is formed with an opening 21. By thus forming the die pad with the opening 21, the bottom portion of the semiconductor chip 19 is brought in contact with the lower portion 15a of the sealing resin 15 underlying the die pad 20, which provides further enhanced adhesion between the semiconductor chip 19 and the sealing resin 15 and improved reliability. Although the semiconductor chip 19 larger in size than the semiconductor chip 12 shown in FIG. 1 has been contained in the sealing resin 15, the plastic encapsulated semiconductor device according to the present embodiment retains high reliability since the structure thereof provides enhanced adhesion between the semiconductor chip 19 and the sealing resin 15.

The present embodiment provides an extremely thin-profile plastic encapsulated semiconductor device with an overall thickness of 0.7 mm. The height of the stepped portion of the die pad support pin 10 formed by the upset process is 0.1 mm, while the thickness of the lower portion 15a of the sealing resin 15 underlying the die pad 20 is 0.1 mm. The thickness of the semiconductor chip 19 is 0.2 mm, while the thickness of the upper portion 15a of the sealing resin 15 overlying the semiconductor chip 19 is 0.15 mm. The thickness of the lead frame 9 is 0.15 mm.

In summary, the plastic encapsulated semiconductor device according to the present embodiment can achieve the same effect as achieved by the semiconductor device according to the second embodiment. It can also achieve the more remarkable effects of enhancing adhesion between the bottom portion of the semiconductor chip 19 and the sealing resin 15 with the provision of the die pad 20 smaller in size than the semiconductor chip 19 and formed with the opening 21 and suppressing the cracking of a package. With the opening 21, the die pad 20 occupies a further reduced area and requires a much smaller amount of adhesive, while the semiconductor chip 19 is solidly supported on both top and bottom sides at the center thereof.

In addition, the opening 21 formed in the die pad 20 is not configured as a rectangle having sides extending along the outer circumference of the die pad 20 but has four corners each formed into a quadrantal configuration. In the arrangement, each of the four corner portions of the die pad 20 has a sufficient expanse to achieve the following effect. In the step of mounting the semiconductor chip 19 on the die pad 20, an adhesive supplied dropwise to the individual corner portions spreads thereover without being pushed out of the top face of the die pad 20 even when the semiconductor chip 19 and the die pad 20 are pressed tightly against each other. As a result, bonding sufficiently strong to hold the two members together till the plastic sealing step is initiated is achieved.

Next, a method of manufacturing the plastic encapsulated semiconductor device according to the present embodiment will be described with reference to FIGS. 3(a) and 3(b).

First, the lead frame 9 having the die pad 20, the die pad support pins 10, the leads 13, and the like is formed in an outer frame. Then, the upset process is performed by pressing the respective middle portions of the die pad support pins 10 suspending the die pad 20 to raise the die pad 20, resulting in the stepped portions 17 formed at the respective midpoints of the die pad support pins 10. After a conductive adhesive is supplied dropwise to the individual corner portions of the die pad 20, the semiconductor chip 19 and the die pad 20 are pressed tightly against each other so that the bottom face of the semiconductor chip 19 is bonded to the top face of the die pad 20, whereby the semiconductor chip 19 is mounted on the die pad 20.

Next, the electrode of the semiconductor chip 19 on the die pad 20 is electrically connected to the leads 13 of the lead frame 9 by means of the thin metal wires 14.

Next, a region including the die pad support pins 10, the die pad 20, the semiconductor chip 19, the leads 13, and the thin metal wires 14 is sealed with the sealing resin 15 by transfer molding. As a result, the lower portion 15a of the sealing resin 15 underlies the bottom face of the die pad 20, the upper portion 15b of the sealing resin 15 containing the thin metal wires 14 overlies the top face of the semiconductor chip 19, and the side portion 15c of the sealing resin 15 underlies the semiconductor chip 19 in such a manner as to surround the die pad 20. The bottom face of the lower portion 15a of the sealing resin 15 is substantially flush with the bottom faces of the respective terminal portions 16 of the leads 13, while the top face of the upper portion 15b is higher in level than the uppermost portions of the thin metal wires 14. In the plastic sealing step, hermetical sealing should be achieved by preventing the sealing resin 15 from underlying the bottom portions of the leads 13.

Thereafter, the formation (cutting off) of the leads 13 of the lead frame 9 including separation of the outer frame is performed. Here, the leads 13 are formed such that the outer side portions of the leads 13 are substantially flush with the side faces of the sealing resin (a protrusion length of 0.2 mm or less).

The foregoing procedures enable easy formation of the plastic encapsulated semiconductor device according to the third embodiment.

(Fourth Embodiment)

A plastic encapsulated semiconductor device according to a fourth embodiment of the present invention will be described with reference to the drawings.

Figure 4A:
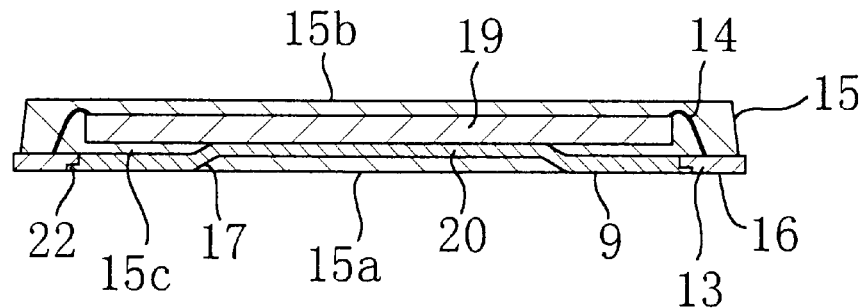
FIG. 4(a) is a cross-sectional view of a plastic encapsulated semiconductor device according to a fourth embodiment of the present invention and FIG. 4(b) is a bottom view thereof when viewed transparently through a sealing resin.
Figure 4B:
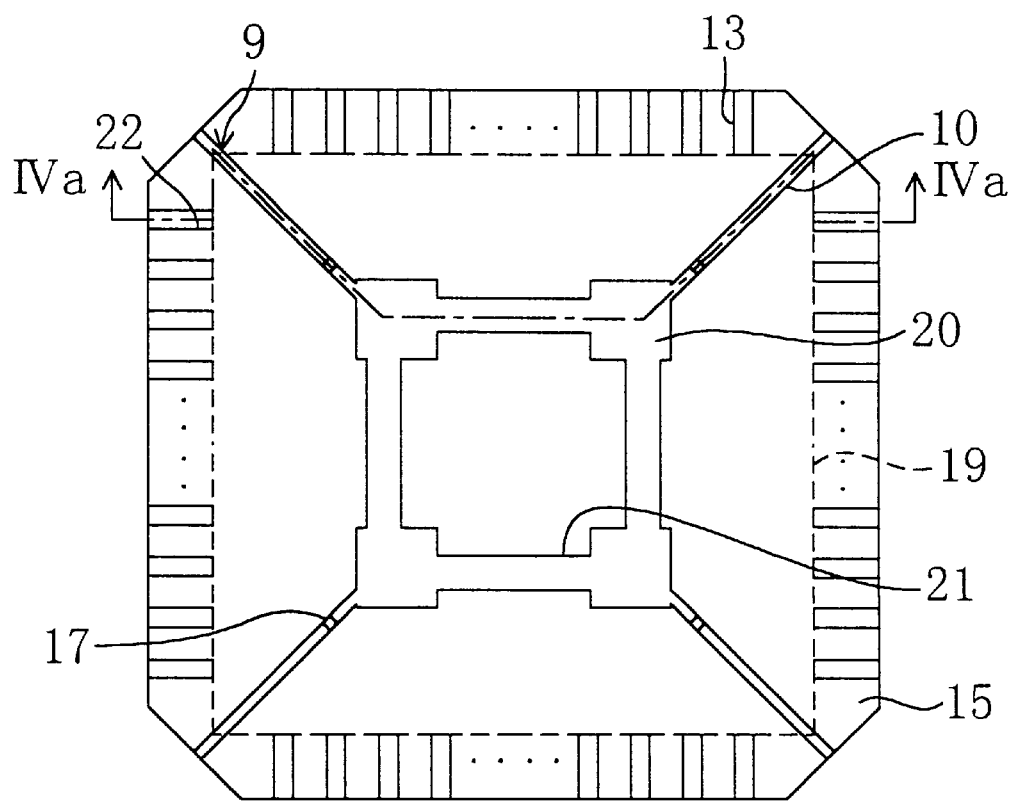

FIGS. 4(a) and 4(b) show the structure of the plastic encapsulated semiconductor device according to the fourth embodiment of the present invention, of which FIG. 4(a) is a cross-sectional view taken along the line IVa—IVa of FIG. 4(b) and FIG. 4(b) is a bottom view. For the sake of convenience, it is assumed in FIG. 4(b) that a sealing resin is transparent and the portion enclosed in the broken rectangle corresponds to a semiconductor chip.

As shown in the drawings, the plastic encapsulated semiconductor device according to the present embodiment comprises: die pad support pins 10 of a lead frame 9; a die pad 20 suspended by the die pad support pins 10; a semiconductor chip 19 mounted on the die pad 20; thin metal wires 14 for electrically connecting an electrode (not shown) on the top face of the semiconductor chip 19 to leads 13; and a sealing resin 15 for sealing the foregoing components 10, 20, 19, 13, and 14. The upset process has been performed to form the die pad support pins 10 with respective stepped portions 17, whereby the die pad 20 is positioned higher in level than the leads 13. In the resulting structure, the lower portion 15a of the sealing resin 15 underlies the die pad 20. The area occupied by the die pad 20 is reduced to be smaller than the bottom area of the semiconductor chip 19 and an opening 21 is formed in the die pad 20 so that the lower portion 15a of the sealing resin 15 underlies the die pad 20 and that the side portion 15c of the sealing resin 15 underlies the semiconductor chip 19 in such a manner as to surround the die pad 20. The arrangement enhances adhesion between the semiconductor chip 19 and the sealing resin 15 and suppresses the cracking of a package. The leads 13 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 13 to wiring on a mother substrate. The structure of the plastic encapsulated semiconductor device according to the present embodiment described above is basically the same as that of the plastic encapsulated semiconductor device according to the third embodiment.

In contrast to the third embodiment, the plastic encapsulated semiconductor device according to the present embodiment is characterized in that respective inner bottom portions of the leads 13 are removed to form stepped portions 22 and that each of the corner portions of the die pad 20 is formed into a circular configuration. Since the stepped portions 22 have been formed by removing the respective inner bottom portions of the leads 13, each of the leads is partially in contact with the sealing resin 15 on both sides thereof, which enhances adhesion between the lead 13 and the sealing resin 15. Moreover, the circular corner portions of the die pad 20 provide the advantage of smooth application of an adhesive over the semiconductor device according to the third embodiment.

Although the semiconductor chip 19 larger in size than the semiconductor chip 12 shown in FIG. 1 has been contained in the sealing resin 15, the plastic encapsulated semiconductor device according to the present embodiment retains high reliability since the structure thereof provides enhanced adhesion between the semiconductor chip 19 and the sealing resin 15.

The present embodiment provides an extremely thin-profile plastic encapsulated semiconductor device with an overall thickness of 0.7 mm. The height of the stepped portion of the die pad support pin 10 formed by the upset process is 0.1 mm, while the thickness of the lower portion 15a of the sealing resin 15 underlying the die pad 20 is 0.1 mm. The thickness of the semiconductor chip 19 is 0.2 mm, while the thickness of the upper portion 15a of the sealing resin 15 overlying the semiconductor chip 19 is 0.15 mm. The thickness of the lead frame 9 is 0.15 mm.

In summary, the plastic encapsulated semiconductor device according to the present embodiment can achieve the same effect as achieved by the semiconductor device according to the third embodiment. Additionally, the stepped portions 22 formed by removing the respective inner bottom portions of the leads 13 further enhances adhesion between the leads 13 and the sealing resin 15.

Next, a method of manufacturing the plastic encapsulated semiconductor device according to the present embodiment will be described with reference to FIGS. 4(a) and 4(b).

First, the lead frame 9 having the die pad 20 formed with the opening 21, the die pad support pins 10, the leads 13, and the like is formed in an outer frame. Then, the respective inner bottom portions of the leads 13 are removed by using an etching technique to form the stepped portions 22. The etching process is termed half etching, which enables partial etching of the leads 13 to form the stepped portions 22. After that, the upset process is performed by pressing the respective middle portions of the die pad support pins 10 suspending the die pad 20 to raise the die pad 20, resulting in the stepped portions 17 formed at the respective midpoints of the die pad support pins 10. After a conductive adhesive is supplied dropwise to the individual corner portions of the die pad 20, the semiconductor chip 19 and the die pad 20 are pressed tightly against each other so that the bottom face of the semiconductor chip 19 is bonded to the top face of the die pad 20, whereby the semiconductor chip 19 is mounted on the die pad 20.

Next, the electrode of the semiconductor chip 19 on the die pad 20 is electrically connected to the leads 13 of the lead frame 9 by means of the thin metal wires 14.

Next, a region including the die pad support pins 10, the die pad 20, the semiconductor chip 19, the leads 13, and the thin metal wires 14 is sealed with the sealing resin 15 by transfer molding. As a result, the lower portion 15a of the sealing resin 15 underlies the bottom face of the die pad 20, the upper portion 15b of the sealing resin 15 containing the thin metal wires 14 overlies the top face of the semiconductor chip 19, and the side portion 15c of the sealing resin 15 underlies the semiconductor chip 19 in such a manner as to surround the die pad 20. The bottom face of the lower portion 15a of the sealing resin 15 is substantially flush with the bottom faces of the respective terminal portions 16 of the leads 13, while the top face of the upper portion 15b is higher in level than the uppermost portions of the thin metal wires 14. In the plastic sealing step, hermetical sealing should be achieved by preventing the sealing resin 15 from underlying the bottom portions of the leads 13.

Thereafter, the formation (cutting off) of the leads 13 of the lead frame 9 including separation of the outer frame is performed. Here, the leads 13 are formed such that the outer side portions of the leads 13 are substantially flush with the side faces of the sealing resin (a protrusion length of 0.2 mm or less).

The foregoing procedures enable easy formation of the plastic encapsulated semiconductor device according to the fourth embodiment.

(Fifth Embodiment)

A plastic encapsulated semiconductor device according to a fifth embodiment of the present invention will be described with reference to the drawings.

Figure 5A:
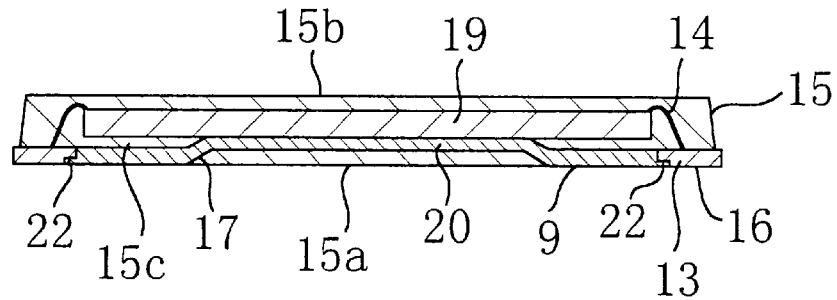
FIG. 5(a) is a cross-sectional view of a plastic encapsulated semiconductor device according to a fifth embodiment of the present invention and FIG. 5(b) is a bottom view thereof when viewed transparently through a sealing resin.
Figure 5B:
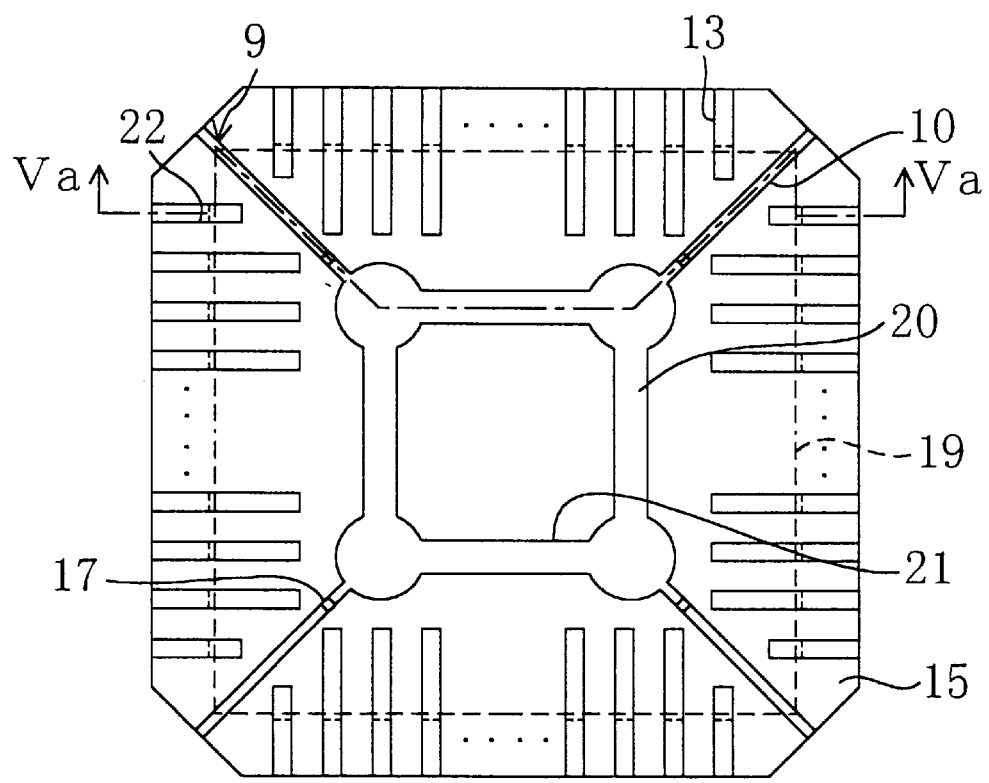

FIGS. 5(a) and 5(b) show the structure of the plastic encapsulated semiconductor device according to the fifth embodiment of the present invention, of which FIG. 5(a) is a cross-sectional view taken along the line Va—Va of FIG. 5(b) and FIG. 5(b) is a bottom view. For the sake of convenience, it is assumed in FIG. 5(b) that a sealing resin is transparent and the portion enclosed in the broken rectangle corresponds to a semiconductor chip.

As shown in the drawings, the plastic encapsulated semiconductor device according to the present embodiment comprises: die pad support pins 10 of a lead frame 9; a die pad 20 suspended by the die pad support pins 10; a semiconductor chip 19 mounted on the die pad 20; thin metal wires 14 for electrically connecting an electrode (not shown) on the top face of the semiconductor chip 19 to leads 13; and a sealing resin 15 for sealing the foregoing components 10, 20, 19, 13, and 14. The upset process has been performed to form the die pad support pins 10 with respective stepped portions 17, whereby the die pad 20 is positioned higher in level than the leads 13. In the resulting structure, the lower portion 15a of the sealing resin 15 underlies the die pad 20. The area occupied by the die pad 20 is reduced to be smaller than the bottom area of the semiconductor chip 19 and an opening 21 is formed in the die pad 20 so that the lower portion 15a of the sealing resin 15 underlies the die pad 20 and that the side portion 15c of the sealing resin 15 underlies the semiconductor chip 19 in such a manner as to surround the die pad 20. The arrangement enhances adhesion between the semiconductor chip 19 and the sealing resin 15 and suppresses the cracking of a package. The leads 13 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 13 to wiring on a mother substrate. Furthermore, the stepped portions 22 formed by removing the respective inner bottom portions of the leads 13 provide enhanced adhesion between the lead 13 and the sealing resin 15. The structure of the plastic encapsulated semiconductor device according to the present embodiment described above is basically the same as that of the plastic encapsulated semiconductor device according to the fourth embodiment.

In contrast to the fourth embodiment, the plastic encapsulated semiconductor device according to the present embodiment is characterized in that the tip portion of each of the leads 13 is extended to a point under the semiconductor chip 19 and that each of the corner portions of the die pad 20 is formed into a square configuration. By thus extending the inner portion of the lead 13 to a point under the semiconductor chip 19, the contact area between the lead 13 and the sealing resin 15 can further be enlarged, which provides enhanced adhesion and improved reliability. Moreover, the square corner portions of the die pad 20 provide the advantage of smooth application of an adhesive over the semiconductor device according to the third embodiment.

Although the semiconductor chip 19 larger in size than the semiconductor chip 12 shown in FIG. 1 has been contained in the sealing resin 15, the plastic encapsulated semiconductor device according to the present embodiment retains high reliability since the structure thereof provides enhanced adhesion between the semiconductor chip 19 and the sealing resin 15.

The plastic encapsulated semiconductor device according to the present embodiment can achieve the same effect as achieved by the semiconductor device according to the fourth embodiment. Additionally, the inner portion of each of the leads 13 extended to a point under the semiconductor chip 9 further enlarges the contact area between the lead 13 and the sealing resin 15, resulting in enhanced adhesion and improved reliability.

Next, a method of manufacturing the plastic encapsulated semiconductor device according to the present embodiment will be described with reference to FIGS. 5(a) and 5(b).

First, the lead frame 9 having the die pad 20 formed with the opening 21, the die pad support pins 10, the leads 13, and the like is formed in an outer frame. Then, the respective inner bottom portions of the leads 13 are removed by using an etching technique to form the stepped portions 22. The etching process is termed half etching, which enables partial etching of the leads 13 to form the stepped portions 22. After that, the upset process is performed by pressing the respective middle portions of the die pad support pins 10 suspending the die pad 20 to raise the die pad 20, resulting in the stepped portions 17 formed at the respective midpoints of the die pad support pins 10. After a conductive adhesive is supplied dropwise to the individual corner portions of the die pad 20, the semiconductor chip 19 and the die pad 20 are pressed tightly against each other so that the bottom face of the semiconductor chip 19 is bonded to the top face of the die pad 20, whereby the semiconductor chip 19 is mounted on the die pad 20.

Next, the electrode of the semiconductor chip 19 on the die pad 20 is electrically connected to the leads 13 of the lead frame 9 by means of the thin metal wires 14.

Next, a region including the die pad support pins 10, the die pad 20, the semiconductor chip 19, the leads 13, and the thin metal wires 14 is sealed with the sealing resin 15 by transfer molding. As a result, the lower portion 15a of the sealing resin 15 underlies the bottom face of the die pad 20, the upper portion 15b of the sealing resin 15 containing the thin metal wires 14 overlies the top face of the semiconductor chip 19, and the side portion 15c of the sealing resin 15 underlies the semiconductor chip 19 in such a manner as to surround the die pad 20. The bottom face of the lower portion 15a of the sealing resin 15 is substantially flush with the bottom faces of the respective terminal portions 16 of the leads 13, while the top face of the upper portion 15b is higher in level than the uppermost portions of the thin metal wires 14. In the plastic sealing step, hermetical sealing should be achieved by preventing the sealing resin 15 from underlying the bottom portions of the leads 13.

Thereafter, the formation (cutting off) of the leads 13 of the lead frame 9 including separation of the outer frame is performed. Here, the leads 13 are formed such that the outer side portions of the leads 13 are substantially flush with the side faces of the sealing resin (a protrusion length of 0.2 mm or less).

The foregoing procedures enable easy formation of the plastic encapsulated semiconductor device according to the fifth embodiment.

(Sixth Embodiment)

A plastic encapsulated semiconductor device according to a sixth embodiment of the present invention will be described with reference to the drawings.

Figure 6A:
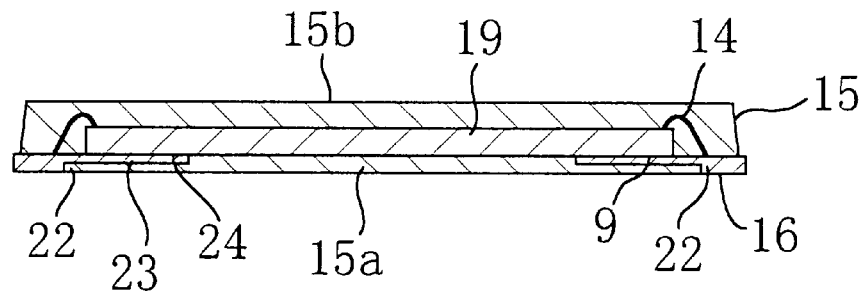
FIG. 6(a) is a cross-sectional view of a plastic encapsulated semiconductor device according to a sixth embodiment of the present invention and FIG. 6(b) is a bottom view thereof when viewed transparently through a sealing resin.
Figure 6B:
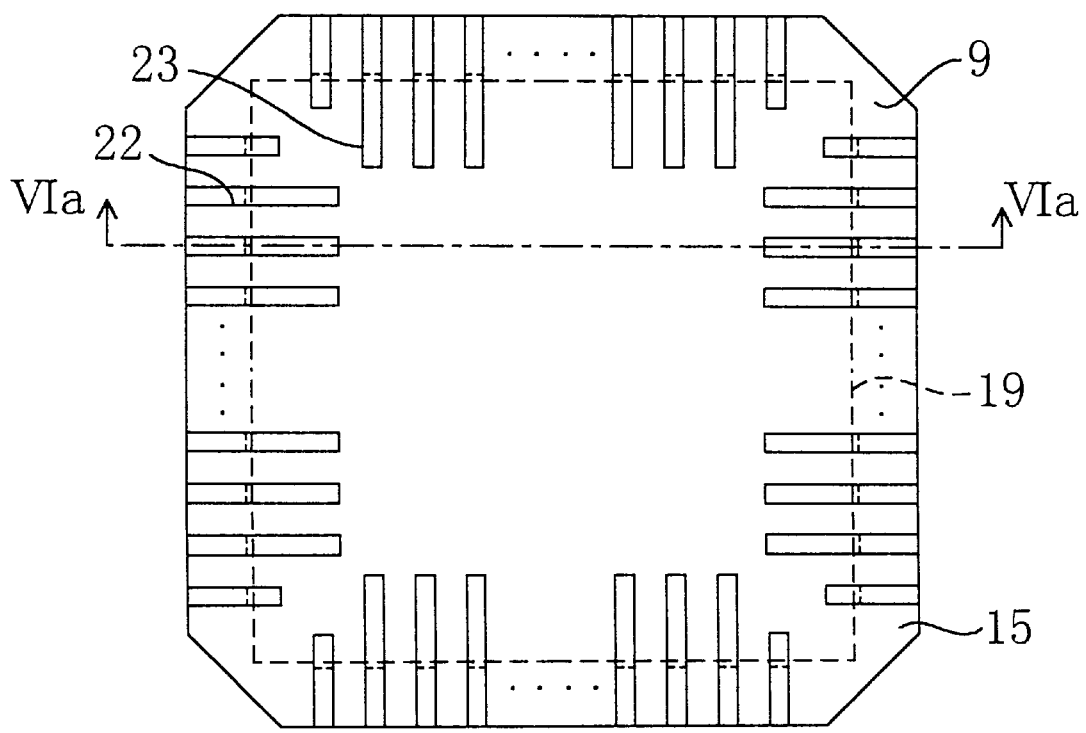

FIGS. 6(a) and 6(b) show the structure of the plastic encapsulated semiconductor device according to the sixth embodiment of the present invention, of which FIG. 6(a) is a cross-sectional view taken along the line VIa—VIa of FIG. 6(b) and FIG. 6(b) is a bottom view. For the sake of convenience, it is assumed in FIG. 6(b) that a sealing resin is transparent and the portion enclosed in the broken rectangle corresponds to a semiconductor chip.

As shown in the drawings, the plastic encapsulated semiconductor device according to the present embodiment comprises: a semiconductor chip 19 mounted on leads 23 of a lead frame 9 via an insulating material 24; thin metal wires 14 for electrically connecting an electrode (not shown) on the top face of the semiconductor chip 19 to the leads 23; and a sealing resin 15 for sealing the foregoing components 19, 23, 24, and 14. Since each of the leads 23 has a stepped portion 22 formed by removing an inner bottom portion thereof as well as a tip portion extended to a point under the semiconductor chip 19, enhanced adhesion is achieved between the leads 23 and the sealing resin 15. The leads 23 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 23 to wiring on a mother substrate.

In contrast to the first to fifth embodiments, the plastic encapsulated semiconductor device according to the present embodiment is characterized in that it has a so-called chip-on-lead structure in which the semiconductor chip 19 is mounted on the leads 23 via the insulating material 24 without using a die pad. The structure allows the lower portion 15a of the sealing resin to widely spread under the semiconductor chip 19, thereby achieving high reliability and an extremely thin profile simultaneously. Moreover, since the tip portions of the leads 23 are greatly extended under the bottom face of the semiconductor chip 19, the contact area and adhesion between the leads 23 and the sealing resin 15 can be increased, resulting in a semiconductor device with improved reliability. The present embodiment is similar to the fourth and fifth embodiments in that the adhesion to the sealing resin 15 has further been enhanced by removing the inner bottom portions of the leads 23 and thereby forming the stepped portions 22.

In summary, the plastic encapsulated semiconductor device has a thinner profile than the structures according to the first to fifth embodiments because the top face of the semiconductor chip 19 has been lowered in level without using a die pad. Since the bottom portion of the semiconductor chip 19 is in contact with the sealing resin 15 over a wide range, the effect of enhancing adhesion between the sealing resin 15 and the lead frame 9 is increased and the effect of suppressing the cracking of a package is also increased since the area over which the adhesive has spread between the semiconductor chip 19 and the leads 23 is not as large as the area over which the adhesive spreads between the semiconductor chip and a die pad. As a result, there can be achieved extremely high reliability.

Next, a method of manufacturing the plastic encapsulated semiconductor device according to the present embodiment will be described with reference to FIGS. 6(a) and 6(b).

First, the lead frame 9 having no die pad and no die pad support pin is formed in an outer frame. Then, the respective inner bottom portions of the leads 23 are removed by an etching technique to form the stepped portions 22. The etching process is termed half etching, which enables partial etching of the leads 23 to form the stepped portions 22. The inner tip portion of each of the leads 23 is formed into a configuration extending toward the center of the lead frame 9. The semiconductor chip 19 is mounted on the leads 23 via the insulating material 24. In this case, a polyimide-based resin may be used as the insulating material 24. The insulating material 24 may also be used as an adhesive in bonding the semiconductor chip 19 to the leads 23.

Alternatively, a conductive adhesive may be used for achieving bonding therebetween.

Next, the electrode of the semiconductor chip 19 on the leads 23 is electrically connected to the leads 23 by means of the thin metal wires 14.

Next, a region including the semiconductor chip 19, the leads 23, the insulating material 24, and the thin metal wires 14 is sealed with the sealing resin 15 by transfer molding. As a result, the lower portion 15a of the sealing resin 15 underlies the bottom face of the semiconductor chip 19, while the upper portion 15b of the sealing resin 15 containing the thin metal wires 14 overlies the top face of the semiconductor chip 19. The bottom face of the lower portion 15a of the sealing resin 15 is substantially flush with the bottom faces of the respective terminal portions 16 of the leads 23, while the top face of the upper portion 15b thereof is higher in level than the uppermost portions of the thin metal wires 14. In the plastic sealing step, hermetical sealing should be achieved by preventing the sealing resin 15 from underlying the bottom portions of the leads 23.

Thereafter, the formation (cutting off) of the leads 23 of the lead frame 9 including separation of the outer frame is performed. Here, the leads 23 are formed such that the outer side portions thereof are substantially flush with the side faces of the sealing resin (a protrusion length of 0.2 mm or less).

The foregoing procedures enable easy formation of the plastic encapsulated semiconductor device according to the sixth embodiment.

(Seventh Embodiment)

A plastic encapsulated semiconductor device according to a seventh embodiment of the present invention will be described with reference to the drawings.

Figure 8:
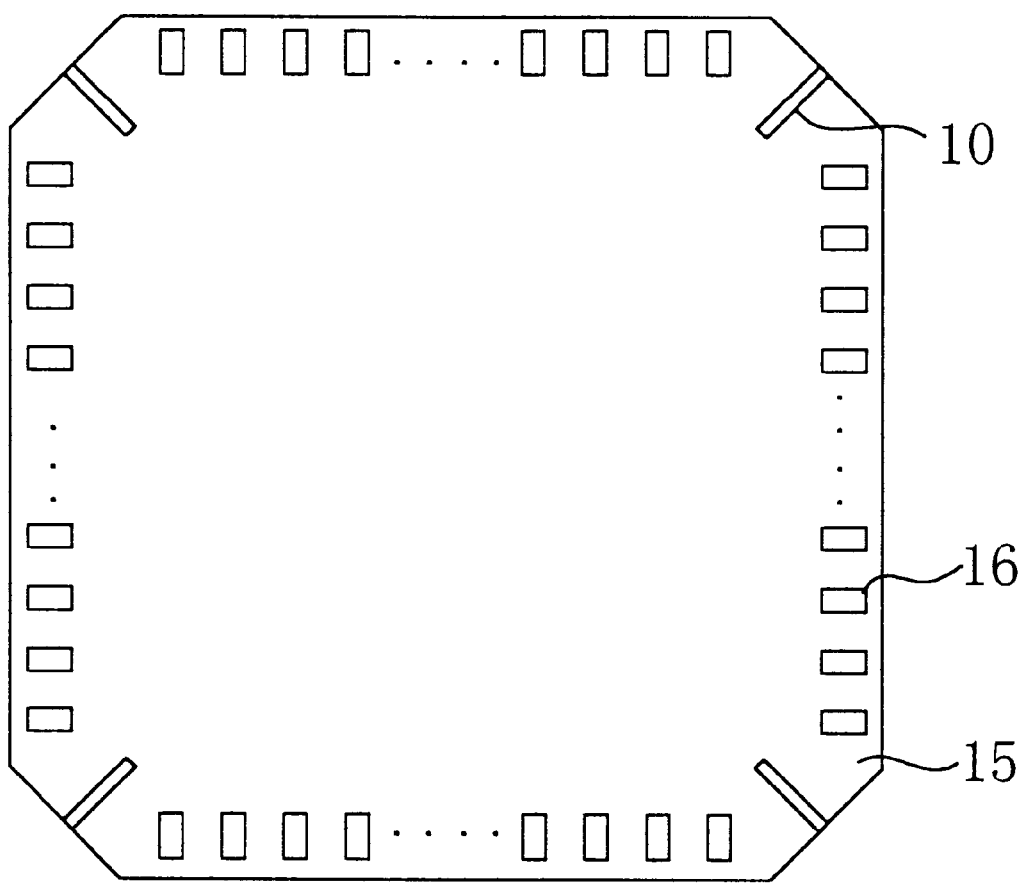
FIG. 8 is a bottom view of the plastic encapsulated semiconductor device according to the seventh embodiment when viewed not transparently through the sealing resin.

FIGS. 7(a) to 7(c) and FIG. 8 show the structure of the plastic encapsulated semiconductor device according to the seventh embodiment of the present invention, of which FIG. 7(a) is a cross-sectional view taken along the line VIIa—VIIa of FIG. 7(c), FIG. 7(b) is an enlarged cross-sectional view of a part of the structure shown in FIG. 7(a), and FIG. 7(c) is a bottom view of the plastic encapsulated semiconductor device when viewed transparently through a sealing resin. In FIG. 7(b), the portion enclosed in the broken rectangle corresponds to a semiconductor chip. FIG. 8 is a bottom view of the plastic encapsulated semiconductor device when viewed not transparently through the sealing resin.

As shown in the drawings, the plastic encapsulated semiconductor device according to the present embodiment comprises: die pad support pins 10 of a lead frame 9; a die pad 11 suspended by the die pad support pins 10; a semiconductor chip 19 mounted on the die pad 11; thin metal wires 14 for electrically connecting an electrode (not shown) on the top face of the semiconductor chip 19 to leads 13; and a sealing resin 15 for sealing the foregoing components 10, 11, 19, 13, and 14. The upset process has been performed to form the die pad support pins 10 with respective stepped portions 17, whereby the die pad 20 is positioned higher in level than the leads 13. In the resulting structure, the lower portion 15a of the sealing resin 15 underlies the die pad 11. The area occupied by the die pad 11 is reduced to be smaller than the bottom area of the semiconductor chip 19 so that the lower portion 15a of the sealing resin 15 underlies the die pad 11. The arrangement enhances adhesion between the semiconductor chip 19 and the sealing resin 15. The leads 13 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 13 to wiring on a mother substrate. The structure of the plastic encapsulated semiconductor device according to the present embodiment described above is basically the same as that of the plastic encapsulated semiconductor device according to the third embodiment.

In contrast to the third embodiment, the plastic encapsulated semiconductor device according to the present embodiment is characterized in that inner and outer bottom portions of each of the leads 13 are removed to form a terminal portion constituted by a remaining projecting middle portion. As a result, only the projecting terminal portion 16 of the bottom portion of each of the leads 13 has its surface exposed at the bottom face of the plastic encapsulated semiconductor device, while the other bottom portion thereof is buried in the sealing resin 15. The configuration of the lead 13 achieves an anchoring effect and prevents the lead 13 from peeling off the sealing resin 15. The structure has been implemented by focusing attention on the fact that the sealing resin 15 has a particularly reduced thickness at the bottom face of the plastic encapsulated semiconductor device and, even when the leads 13 are buried in the sealing resin 15, the leads 13 may peel off because of a weak fastening force or an external force applied thereto.

Although the die pad support pins 10 are partially exposed in FIG. 8, the exposed portions correspond to the portions of the die pad support pins 10 other than the stepped portions 17 formed by the upset process.

The present embodiment provides an extremely thin-profile plastic encapsulated semiconductor device with an overall thickness of 0.7 mm. The thickness of the stepped portion of the die pad support pin 10 formed by the upset process is 0.1 mm, while the thickness of the lower portion 15a of the sealing resin 15 underlying the die pad 11 is 0.1 mm. The thickness of the semiconductor chip 19 is 0.2 mm, while the thickness of the upper portion 15a of the sealing resin 15 overlying the semiconductor chip 19 is 0.15 mm. The thickness of the lead frame 9 is 0.15 mm.

Next, a method of manufacturing the plastic encapsulated semiconductor device according to the present embodiment will be described with reference to FIGS. 7(a) to 7(c).

First, the lead frame 9 having the die pad 11, the die pad support pins 10, the leads 13, and the like is formed in an outer frame. Then, a half etching process is performed with respect to the bottom portions of the leads 13 of the lead frame 9 to remove the inner and outer bottom portions of the leads 13 and thereby form the projecting terminal portions 16. After that, the upset process is performed by pressing the respective middle portions of the die pad support pins 10 suspending the die pad 11 to raise the die pad 11, resulting in the stepped portions 17 formed at the respective mid-points of the die pad support pins 10. After a conductive adhesive is supplied dropwise to the individual corner portions of the die pad 11, the semiconductor chip 19 and the die pad 11 are pressed tightly against each other so that the bottom face of the semiconductor chip 19 is bonded to the top face of the die pad 11, whereby the semiconductor chip 19 is mounted on the die pad 11.

Next, the electrode of the semiconductor chip 19 on the die pad 11 is electrically connected to the leads 13 of the lead frame 9 by means of the thin metal wires 14.

Next, a region including the die pad support pins 10, the die pad 11, the semiconductor chip 19, the leads 13, and the thin metal wires 14 is sealed with the sealing resin 15 by transfer molding. As a result, the lower portion 15a of the sealing resin 15 underlies the bottom face of the die pad 11, the upper portion 15b of the sealing resin 15 containing the thin metal wires 14 overlies the top face of the semiconductor chip 19, and the side portion 15c of the sealing resin 15 underlies the semiconductor chip 19 in such a manner as to surround the die pad 11. The bottom face of the lower portion 15a of the sealing resin 15 is substantially flush with the bottom faces of the respective terminal portions 16 of the leads 13, while the top face of the upper portion 15b is higher in level than the uppermost portions of the thin metal wires 14. In the plastic sealing step, hermetical sealing should be achieved by preventing the sealing resin 15 from underlying the bottom portions of the leads 13.

Thereafter, the formation (cutting off) of the leads 13 of the lead frame 9 including separation of the outer frame is performed. Here, the leads 13 are formed such that the outer side portions thereof are substantially flush with the side faces of the sealing resin (a protrusion length of 0.2 mm or less).

The foregoing procedures enable easy formation of the plastic encapsulated semiconductor device according to the seventh embodiment.

(Eighth Embodiment)

A plastic encapsulated semiconductor device according to an eighth embodiment of the present invention will be described with reference to the drawings.

Figure 10:
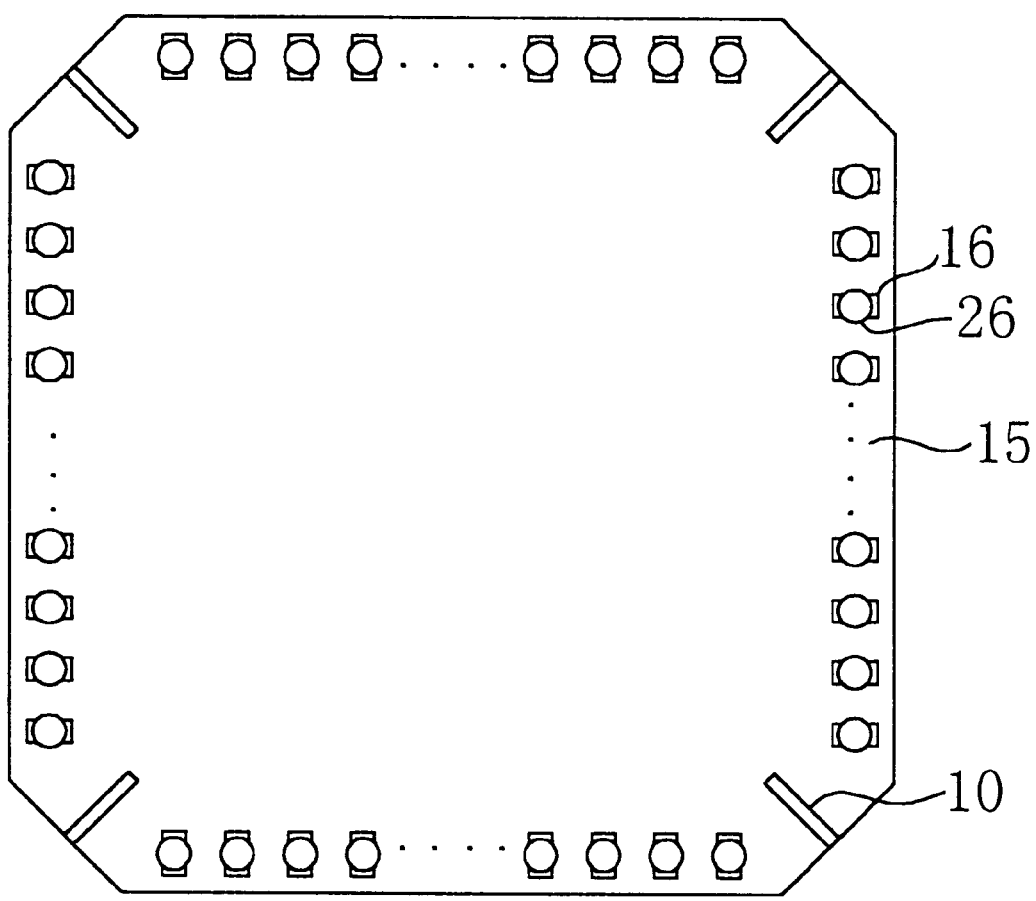
FIG. 10 is a bottom view of the plastic encapsulated semiconductor device according to the eighth embodiment when viewed not transparently through the sealing resin.

FIGS. 9(a) to 9(c) and FIG. 10 show the structure of the plastic encapsulated semiconductor device according to the eighth embodiment of the present invention, of which FIG. 9(a) is a cross-sectional view taken along the line IXa—IXa of FIG. 9(c), FIG. 9(b) is an enlarged cross-sectional view of a part of the structure shown in FIG. 9(a), and FIG. 9(c) is a bottom view of the plastic encapsulated semiconductor device when viewed transparently through a sealing resin. In FIG. 9(b), the portion enclosed in the broken rectangle corresponds to a semiconductor chip. FIG. 10 is a bottom view of the plastic encapsulated semiconductor device when viewed not transparently through the sealing resin.

As shown in the drawings, the plastic encapsulated semiconductor device according to the present embodiment comprises: die pad support pins 10 of a lead frame 9; a die pad 11 suspended by the die pad support pins 10; a semiconductor chip 19 mounted on the die pad 11; thin metal wires 14 for electrically connecting an electrode (not shown) on the top face of the semiconductor chip 19 to leads 13; a sealing resin 15 for sealing the foregoing components 10, 11, 19, 13, and 14; and terminal portions 16 serving as external terminals arranged on the bottom-face region of the sealing resin 15 and connected to the leads 13. The upset process has been performed to form the die pad support pins 10 with respective stepped portions 17, whereby the die pad 20 is positioned higher in level than the leads 13. In the resulting structure, the lower portion 15a of the sealing resin 15 underlies the die pad 11. The area occupied by the die pad 11 is reduced to be smaller than the bottom area of the semiconductor chip 19 so that the lower portion 15a of the sealing resin 15 underlies the die pad 11. The arrangement enhances adhesion between the semiconductor chip 19 and the sealing resin 15. The leads 13 are barely protruding from the side faces of the sealing resin 15 (a protrusion length of about 0.2 mm or less) and are substantially flush with the side faces. The semiconductor device according to the present embodiment is signally connected to external equipment by connecting terminal portions 16 constituted by the bottom portions of the leads 13 to wiring on a mother substrate. Moreover, the middle bottom portions of the leads 13 are left by half etching for removing the inner and outer bottom portions of the leads 13 to form projecting terminal portions 16. The projecting terminal portions 16 achieve the anchoring effect and thereby enhances the ability of the sealing resin 15 to hold the leads 13. The structure of the plastic encapsulated semiconductor device according to the present embodiment described above is basically the same as that of the plastic encapsulated semiconductor device according to the seventh embodiment.

In contrast to the seventh embodiment, the plastic encapsulated semiconductor device according to the present embodiment is characterized in that additional ball electrodes 26 composed of solder balls are provided on the bottom faces of the terminal portions 16 of the leads 13. The provision of the ball electrodes 26 on the surfaces of the terminal portions 16 achieves stable bonding in mounting the plastic encapsulated semiconductor device on the mother substrate as well as improved mountability.

Next, a method of manufacturing a plastic encapsulated semiconductor device according to the present embodiment will be described with reference to FIGS. 9(a) to 9(c).

First, the lead frame 9 having the die pad 11, the die pad support pins 10, the leads 13, and the like is formed in an outer frame. Then, a half etching process is performed with respect to the leads 13 of the lead frames 13 to remove the inner and outer bottom portions of the leads 13 and thereby form the projecting terminal portions 16. After that, the upset process is performed by pressing the respective middle portions of the die pad support pins 10 suspending the die pad 11 to raise the die pad 11, resulting in the stepped portions 17 formed at the respective midpoints of the die pad support pins 10. After a conductive adhesive is supplied dropwise to the individual corner portions of the die pad 11, the semiconductor chip 19 and the die pad 11 are pressed tightly against each other so that the bottom face of the semiconductor chip 19 is bonded to the top face of the die pad 11, whereby the semiconductor chip 19 is mounted on the die pad 11.

Next, the electrode of the semiconductor chip 19 on the die pad 11 is electrically connected to the leads 13 of the lead frame 9 by means of the thin metal wires 14.

Next, the region including the die pad support pins 10, the die pad 11, the semiconductor chip 19, the leads 13, and the thin metal wires 14 is sealed with the sealing resin 15 by transfer molding. As a result, the lower portion 15a of the sealing resin 15 underlies the bottom face of the die pad 11, the upper portion 15b of the sealing resin 15 containing the thin metal wires 14 overlies the top face of the semiconductor chip 19, and the side portion 15c of the sealing resin 15 underlies the semiconductor chip 19 in such a manner as to surround the die pad 11. The bottom face of the lower portion 15a of the sealing resin 15 is substantially flush with the bottom faces of the respective terminal portions 16 of the leads 13, while the top face of the upper portion 15b thereof is higher in level than the uppermost portions of the thin metal wires 14. In the plastic sealing step, hermetical sealing should be achieved by preventing the sealing resin 15 from underlying the bottom portions of the leads 13.

Thereafter, the formation (cutting off) of the leads 13 of the lead frame 9 including separation of the outer frame is performed. Here, the leads 13 are formed such that the outer side portions of the leads 13 are substantially flush with the side faces of the sealing resin (a protrusion length of 0.2 mm or less).

Finally, the ball electrodes are formed on the surfaces of the terminal portions 16 exposed at the bottom face. In the case where solder balls are provided as the ball electrodes 26, they can be formed by bringing the surfaces of the terminal portions 16 in contact with a mold provided with a solder.

The foregoing procedures enable easy formation of the plastic encapsulated semiconductor device according to the eighth embodiment.

Although the leads 13 and 23 have been connected to the mother substrate via the terminal portions 16 constituted by the bottom portions thereof because the leads are not protruding outwardly in each of the foregoing embodiments, the present invention is not limited to the structures of the leads according to the embodiments. The first to sixth embodiments may adopt the structure in which outer leads are laterally protruding from the sealing resin and inserted into the portion of the mother substrate on which the semiconductor device is to be mounted.

In the seventh and eighth embodiments, only the outer bottom portions of the leads 13 may be removed so that the inner portions thereof serve as the terminal portions 16.

We claim:

1. A plastic encapsulated semiconductor device comprising:
   a plurality of die pad support pins;
   a die pad suspended by said plurality of die pad support pins;
   a plurality of leads extending toward said die pad;
   a semiconductor chip mounted on said die pad;
   thin metal wires connecting a part of said semiconductor chip to said individual leads; and
   a sealing resin sealing a region containing said semiconductor chip, said die pad, said die pad support pins, said leads, and said thin metal wires with respective bottom faces and outer side faces of said leads being exposed, each of said die pad support pins being partially bent such that said die pad is positioned higher in level than said leads, said sealing resin partially underlying said die pad.

2. A plastic encapsulated semiconductor device according to claim 1, wherein said die pad occupies an area smaller than an area occupied by said semiconductor chip.

3. A plastic encapsulated semiconductor device according to claim 1, wherein each of said leads has a stepped portion formed by removing an inner bottom portion thereof in such a manner as to substitute the sealing resin for the removed inner bottom portion.

4. A plastic encapsulated semiconductor device according to claim 1, further comprising
   ball electrodes formed on respective exposed terminal portions of said leads.

5. A plastic encapsulated semiconductor device according to claim 1, wherein inner and outer bottom portions of each of said leads are removed in such a manner that the sealing resin substitutes for said removed inner and outer bottom portions with only a middle bottom portion of the lead being uncovered with the sealing resin.

6. A plastic encapsulated semiconductor device according to claim 1, wherein an outer side portion of each of said leads protruding from a side face of the sealing resin has a length of 0.2 mm or less.

7. A plastic encapsulated semiconductor device according to claim 2, wherein said die pad has an opening.

8. A plastic encapsulated semiconductor device according to claim 2, wherein each of said leads has an inner tip extending to a point under said semiconductor device.

9. A plastic encapsulated semiconductor device comprising:
   a semiconductor chip;
   a plurality of leads extending outwardly, while carrying said semiconductor chip on respective inner portions thereof;
   an insulating material interposed between said semiconductor chip and said plurality of leads;
   thin metal wires connecting a part of said semiconductor chip to said individual leads; and
   a sealing resin sealing a region containing said semiconductor chip, said leads, and said thin metal wires, such that said sealing resin is in contact with a part of a bottom face of said semiconductor chip, and a bottom face of an outer portion of each of said leads is exposed,
   wherein a top face and sides faces of said outer portion of each of said leads are in contact with said sealing resin, while said bottom face of said outer portion of each of said leads which is not covered by said sealing resin is operable as an external terminal.

10. A plastic encapsulated semiconductor device comprising:
    a plurality of die pad support pins;
    a die pad having an opening and suspended by said plurality of die pad support pins;
    a plurality of leads extending toward said die pad;
    a semiconductor chip mounted on said die pad and occupying an area larger than an area occupied by said die pad;
    thin metal wires connecting a part of said semiconductor chip to said individual leads; and
    a sealing resin sealing a region containing said semiconductor chip, said die pad, said die pad support pins, said leads, and said thin metal wires, such that said sealing resin is in contact with a part of a bottom face of said semiconductor chip, and a bottom face of an outer portion of each of said leads is exposed,
    wherein a top face and sides faces of said outer portion of each of said leads are in contact with said sealing resin, while said bottom face of said outer portion of each of said leads which is not covered by said sealing resin is operable as an external terminal.

11. A plastic encapsulated semiconductor device according to claim 10, wherein regions of said die pad connected to said die pad support pins occupy an area larger than an area occupied by the other region of said die pad.

12. A plastic encapsulated semiconductor device according to claim 11, wherein each of the regions of said die pad connected to said die pad support pins has a circular configuration.

13. A plastic encapsulated semiconductor device according to claim 11, wherein each of the regions of said die pad connected to said die pad support pins has a rectangular configuration.

* * * * *

UNITED STATES PATENT AND TRADEMARK OFFICE
CERTIFICATE OF CORRECTION

PATENT NO. : 5,942,794
DATED : August 24, 1999
INVENTOR(S) : Okumura et al.

It is certified that error appears in the above-identified patent and that said Letters Patent is hereby corrected as shown below:

Title page,
Item 73, in the Assignee section, after "Matsuhita Electronics Corporation", insert -- , Osaka, Japan --.

Signed and Sealed this

Ninth Day of October, 2001

*Attest:*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO. : 5,942,794
DATED : August 24, 1999
INVENTOR(S) : Okumura et al.

It is certified that error appears in the above-identified patent and that said Letters Patent is hereby corrected as shown below:

Title page,
Item [73] Assignee, change "Matsuhita" to -- Matsushita --.

Signed and Sealed this

Fifteenth Day of January, 2002

Attest:

JAMES E. ROGAN
*Director of the United States Patent and Trademark Office*

*Attesting Officer*